United States Patent
Yin et al.

(10) Patent No.: US 9,548,387 B2
(45) Date of Patent: Jan. 17, 2017

(54) SEMICONDUCTOR DEVICE AND METHOD OF MANUFACTURING THE SAME

(75) Inventors: Huaxiang Yin, Beijing (CN); Changliang Qin, Beijing (CN); Xiaolong Ma, Beijing (CN); Qiuxia Xu, Beijing (CN); Dapeng Chen, Beijing (CN)

(73) Assignee: Institute of Microelectronics, Chinese Academy of Science, Beijing (CN)

( * ) Notice: Subject to any disclaimer, the term of this patent is extended or adjusted under 35 U.S.C. 154(b) by 63 days.

(21) Appl. No.: 13/812,941

(22) PCT Filed: Aug. 27, 2012

(86) PCT No.: PCT/CN2012/001154
§ 371 (c)(1),
(2), (4) Date: Jan. 29, 2013

(87) PCT Pub. No.: WO2014/015450
PCT Pub. Date: Jan. 30, 2014

(65) Prior Publication Data
US 2014/0191335 A1 Jul. 10, 2014

(30) Foreign Application Priority Data
Jul. 25, 2012 (CN) .......................... 2012 1 0260760

(51) Int. Cl.
*H01L 27/088* (2006.01)
*H01L 29/78* (2006.01)
(Continued)

(52) U.S. Cl.
CPC ... *H01L 29/7848* (2013.01); *H01L 21/823412* (2013.01); *H01L 21/823431* (2013.01); *H01L 21/823807* (2013.01); *H01L 21/823821* (2013.01); *H01L 27/0886* (2013.01); *H01L 29/66818* (2013.01); *H01L 29/785* (2013.01); *H01L 29/7845* (2013.01)

(58) Field of Classification Search
None
See application file for complete search history.

(56) References Cited

U.S. PATENT DOCUMENTS

2004/0195624 A1* 10/2004 Liu .................. H01L 21/84
257/347
2006/0076625 A1* 4/2006 Lee et al. ................ 257/353
(Continued)

FOREIGN PATENT DOCUMENTS

CN 1770470 A 5/2006
CN 101577278 A 11/2009

*Primary Examiner* — Cuong Q Nguyen
*Assistant Examiner* — Nishath Yasmeen
(74) *Attorney, Agent, or Firm* — Treasure IP Group, LLC

(57) ABSTRACT

The present invention discloses a semiconductor device, comprising a plurality of fins located on a substrate and extending along a first direction; a plurality of gate stack structures extending along a second direction and across each of the fins; a plurality of stress layers located in the fins on both sides of the gate stack structures and having a plurality of source and drain regions therein; a plurality of channel regions located in the fins below the gate stack structures; characterized in that the stress layers have connected parts in the fins and that the channel regions enclose the connected parts.

5 Claims, 3 Drawing Sheets

(51) Int. Cl.
*H01L 21/8234* (2006.01)
*H01L 21/8238* (2006.01)
*H01L 29/66* (2006.01)

(56) References Cited

U.S. PATENT DOCUMENTS

| | | | |
|---|---|---|---|
| 2008/0173942 A1 | 7/2008 | Zhu et al. | |
| 2010/0301391 A1* | 12/2010 | Lochtefeld | H01L 29/66795 |
| | | | 257/190 |
| 2011/0079829 A1* | 4/2011 | Lai | H01L 29/41791 |
| | | | 257/288 |
| 2011/0133166 A1* | 6/2011 | Bangsaruntip | B82Y 10/00 |
| | | | 257/24 |
| 2011/0272738 A1 | 11/2011 | Oh et al. | |
| 2013/0011983 A1* | 1/2013 | Tsai | H01L 21/82380 |
| | | | 438/285 |

\* cited by examiner

SEMICONDUCTOR DEVICE AND METHOD OF MANUFACTURING THE SAME

CROSS REFERENCE

This application is a National Phase application of, and claims priority to, PCT Application No. PCT/CN2012/001154, filed on Aug. 27, 2012, entitled 'SEMICONDUCTOR DEVICE AND METHOD OF MANUFACTURING THE SAME', which claimed priority to Chinese Application No. CN 201210260760.7, filed on Jul. 25, 2012. Both the PCT Application and Chinese Application are incorporated herein by reference in their entireties.

FIELD OF THE INVENTION

The present invention relates to a semiconductor device and a method of manufacturing the same, in particular, to a FinFET that is capable of enhancing the carrier mobility in the channel region effectively and a method of manufacturing the same.

BACKGROUND OF THE INVENTION

From the 90 nm CMOS integrated circuit technique, Strain Channel Engineering with the purpose of enhancing carrier mobility of channel plays an increasingly important role with continuous reduction of a feature size of a device. Various strain technologies and new materials are used in the device process, that is, introducing a compressive stress or a tensile stress in the channel direction to thereby enhance the channel carrier mobility and improve the device performance.

For example, for 90 nm process node, compressive stress in a PMOS device is provided by using embedded SiGe (e-SiGe) source/drain or using a (100) crystal orientation substrate in combination with a tensile stress contact etch stop layer (tCESL); for 65 nm process node, the first generation source/drain stress memorization technique ($SMT^{\times 1}$) is further adopted on the basis of the 90 nm process node, for example, a dual contact etch stop layer is used; for 45 nm process node, the second generation source/drain stress memorization technique ($SMT^{\times 2}$) is used on the basis of the previous technique, for example, e-SiGe technique may be used in combination with a tCESL or a dual CESL, besides, Stress Proximity Technique (SPT) may be used, moreover, a (110)-plane substrate is adopted for PMOS and a (100)-plane substrate is adopted for NMOS; after 32 nm process node, the third generation source/drain stress memorization technique ($SMT^{\times 3}$) is used, for example, embedded SiC source/drain is used on the basis of the previous techniques to enhance the tensile stress in an NMOS device.

Furthermore, in order to provide a carrier mobility in the channel region, various non-Si based materials, such as Ge, GaAs, InP, GaSb, InAs and InSb whose (electron) mobility is gradually increased, may be adopted.

On the other hand, in the existing sub-20 nm technology, three-dimensional multi-gate devices (FinFET or Tri-gate) become the main device structure, and such a structure enhances the gate control capability and is adaptable to manufacture a fine structure. Further, the stress is also needed to be increased in these three-dimensional multi-gate devices to thereby enhance the carrier mobility and to enhance the device performance. Generally, the stress is applied by a method of selectively epitaxially growing stress fins comprised of above mentioned high mobility materials or strained materials and used as both the source and drain regions and the channel regions, that is, global strained fins by taking the Si line formed by etching on a substrate isolation structure (e.g., SOI) as a substrate. Another method is to selectively epitaxially grow Si to form Si fins by taking the Si line formed by etching on a substrate isolation structure (e.g., SOI) as a substrate, then to selectively grow the above mentioned high-stress materials after removing the original part of Si fins from the source and drain regions to produce an effect of uni-axial strain.

However, in the aforementioned prior art, the technology of channel substrate global strained materials or high mobility substrate materials will cause more technical difficulties as compared with the mainstream uni-axial strain technology such as: the change of energy level, change of density of states, and change of carrier concentration due to change of substrate materials; the effect of growth defects of materials; the problem of matching with different strain requirements of CMOS device; and the problem of compatibility with the mainstream HK/MG.

SUMMARY OF THE INVENTION

As stated above, the present invention aims to overcome the above technical difficulties, thereby increasing the carrier mobility in the channel region in a FinFET effectively to enhance the drive capability of the device.

Therefore, the present invention provides a semiconductor device, comprising a plurality of fins located on a substrate and extending along a first direction; a plurality of gate stack structures extending along a second direction and across each of the fins; a plurality of stress layers located in the fins on both sides of the gate stack structures and having a plurality of source and drain regions therein; a plurality of channel regions located in the fins below the gate stack structures; characterized in that the stress layers have connected parts in the fins and that the channel regions enclose the connected parts.

Wherein the material for the fins is different from that for the stress layers.

Wherein the fins and/or the stress layers are made of a material selected from Si, SiGe, SiSn, GeSn, Si:C, Si:H and SiGe:C, or combinations thereof.

Wherein each of the gate stack structures comprises a gate insulating layer formed of high-K materials and a gate material layer formed of metallic materials.

Wherein the connected parts are of a shape of $\Sigma$, C, and D, or combinations thereof.

Wherein a metal silicide is formed in/on the source and drain regions.

The present invention also provides a method of manufacturing a semiconductor device, comprising forming a plurality of fin structures extending along a first direction on a substrate; forming a plurality of gate stack structures extending along a second direction and across each of the fins; etching the fin structures on both sides of the gate stack structures to form source and drain trenches and to make the source and drain trenches have connected parts below the gate stack structures, the connected parts enclosing channel regions; epitaxially growing stress layers in the source and drain trenches; and forming source and drain regions in the stress layers.

Wherein the material for the fins is different from that for the stress layers.

Wherein the fins and/or the stress layers are made of a material selected from Si, SiGe, SiSn, GeSn, Si:C, Si:H and SiGe:C, or combinations thereof.

Wherein each of the gate stack structures comprises a gate insulating layer formed of high-K materials and a gate material layer formed of metallic materials.

Wherein the connected parts are of a shape of Σ, C, and D, or combinations thereof.

Wherein the step of forming the connected parts further comprises: etching the fin structures on both sides of the gate stack structures to form first trenches having vertical sidewalls; etching the sidewalls of the first trenches to form second trenches, wherein the second trenches have connected parts below the gate stack structures, and said connected parts enclose the channel regions.

Wherein, after forming the source and drain regions, the method further comprises forming a metal silicide in/on the source and drain regions.

Wherein, after forming the source and drain regions, the method further comprises forming an interlayer dielectric layer over the entire device; performing etching to remove the gate stack structures to form gate trenches; and depositing a gate insulating layer formed of high-K materials and a gate material layer formed of metallic materials in the gate trenches.

In accordance with the semiconductor device and the method of manufacturing the same of the present invention, annular stereo strain channel regions along the surface of the silicon fins enclosing the stereo source and drain connection regions are formed by connecting the stereo source and drain comprised of high-stress silicide alloy within the silicon fins, so that the stress in the channel regions is increased all-roundly, and the carrier mobility is enhanced effectively, thereby the drive capability of the device is enhanced efficiently.

BRIEF DESCRIPTION OF THE DRAWINGS

The technical solution of the present invention will be described in detail with reference to the drawings below.

DETAIL DESCRIPTION OF THE EMBODIMENTS

The features and the technical effects of the technical solution of the present application will be described in detail in combination with the illustrative embodiments with reference to the drawings, and disclosed herein a FinFET for enhancing the carrier mobility in the channel region effectively to increase the device drive capability and a method of manufacturing the same. It should be pointed out that like reference signs indicate like structures, the terms such as "first", "second", "above", "below" used in the present invention may be used to modify various device structures or manufacturing processes. Except for specific explanations, these modifications do not imply the spatial, sequential or hierarchical relationships of the structures of the modified device or the manufacturing processes.

Figure 5A:
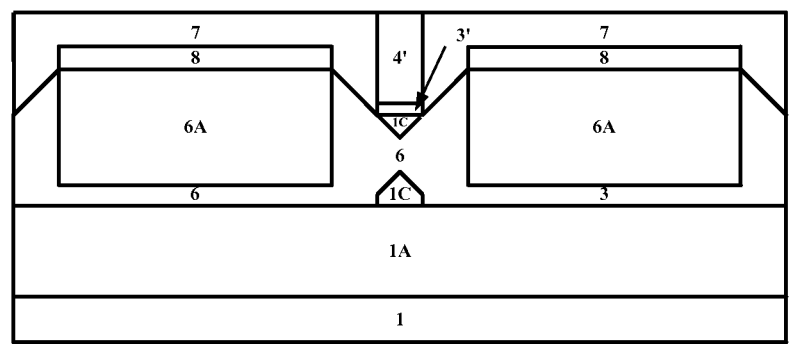
Figure 5B:
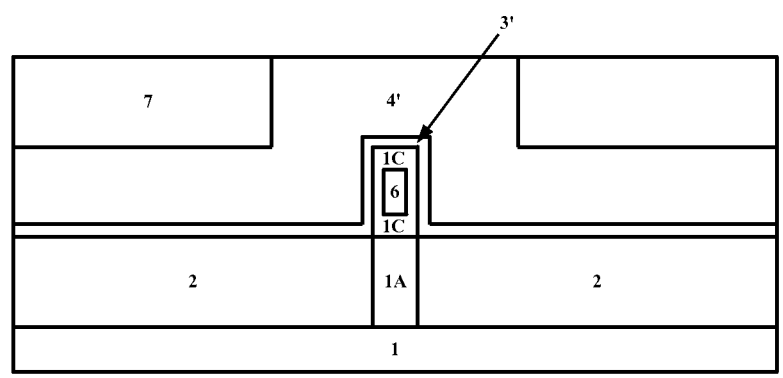
Figure 6:
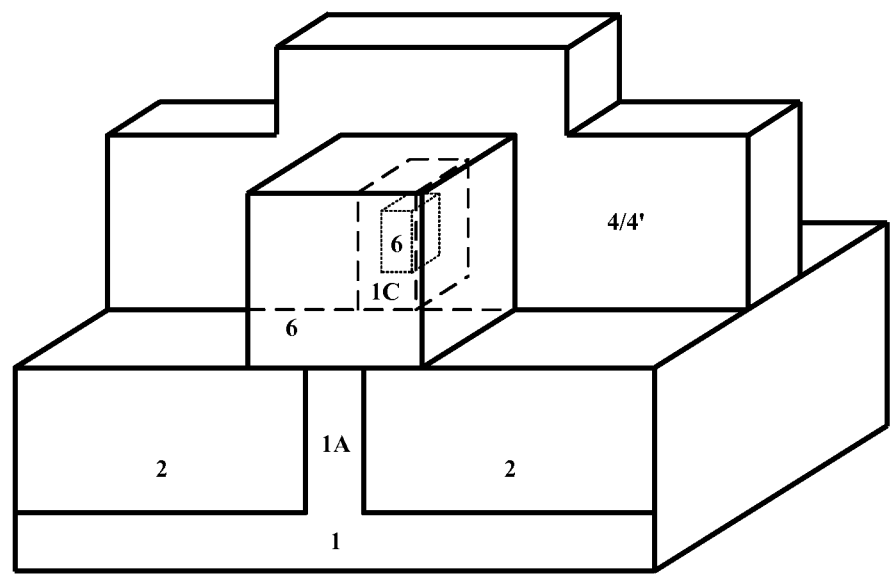
FIG. 6 is a block diagram of a FinFET manufactured in accordance with the present invention.

FIG. 6 is a block diagram of a FinFET manufactured in accordance with the present invention, wherein the FinFET comprises a plurality of fins extending along a first direction, a plurality of gate stack structures extending along a second direction and across each of the fins, a plurality of source and drain regions on the fins on both sides of the gate stack structures, a plurality of channel regions located in the fins below the gate stack structures, wherein the source and drain regions have connected parts in the fins and the channel regions enclose the connected parts. The cross-sectional views for the manufacturing method will be described with reference to FIGS. 1 to 5, and the device structure of FIG. 6 will then be further described in detail below.

Particularly, FIG.*A is a cross-sectional view along the line AA' parallel to the channel direction (along a first direction) in FIG. 6, and FIG. *B is a cross-sectional view along the line BB' perpendicular to the channel direction (along a second direction) in FIG. 6 herein below.

Figure 1A:
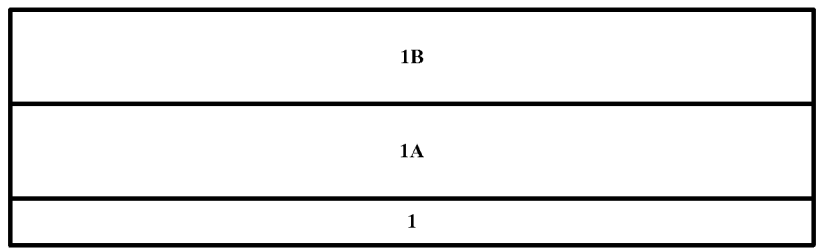
FIG. 1 (FIG. 1A and FIG. 1B) to FIG. 5 (FIG. 5A and FIG. 5B) are diagrammatic cross-sections in accordance with the method steps in manufacturing a FinFET of the present invention, wherein FIG. *A is a cross-sectional view along the line AA' parallel to the channel direction, and FIG. *B is a cross-sectional view along the line BB' perpendicular to the channel direction.
Figure 1B:
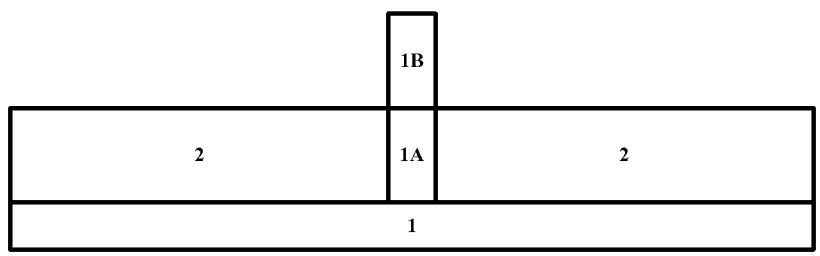

Referring to FIG. 1A and FIG. 1B, a plurality of fin structures extending along a first direction are formed. There is provided a substrate 1, which may be reasonably selected depending on the usage requirement of device and may comprise one of monocrystalline bulk silicon (Si), silicon-on-insulator (SOI), monocrystalline bulk germanium (Ge), germanium-on-insulator (GeOI), strained Si, and SiGe, compound semiconductor materials such as GaN, GaAs, InP, and InSb, or carbon-based semiconductors such as graphene, SiC, and carbon nano tube. Under the consideration of compatibility with CMOS technology, the substrate 1 preferably comprises bulk Si or SOL The substrate 1 is performed photolithography/etching to form therein a plurality of trenches distributed in parallel along a first direction, then an insulating isolation dielectric layer made of silicon oxide or silicon oxynitride etc. is deposited in the trenches by a process such as PECVD, HDPCVD, and rapid thermal oxidation (RTO), to thereby form shallow trench isolations (STI) 2. The substrate 1 between each two STIs 2 constitutes a fin substrate 1A and a fin channel 1B. Preferably, the fin substrate 1A and the fin channel 1B are the same substrate and are simultaneously formed in the STI etch process. The substrate 1A may be doped to isolate the electrical influence between the channel and the substrate. STIs 2 may have a space (that is, the width of the fin substrate 1A and the fin channel 1B) of about, e.g., 2~50 nm, and may have a height/thickness of about, e.g., 5~500 nm. In another way, an epitaxial fin 1B is epitaxially grown on the fin substrate 1A by a process such as UHVCVD, MOCVD, MBE, ALD, and atmospheric pressure epitaxy. The epitaxial fin 1B may be made of the same material as that for the substrate 1 (1A), e.g., both of them are made of Si, or made of other high mobility materials such as Ge, SiGe, SiGe:C, Si:C, Si:H, SiSn, GeSn, GaAs, InP, GaSb, InAs, and InSb. In order to be compatible with the COMS technology and the mainstream HK/MG technology, the epitaxial fin 1B is preferably made of one of Si, SiGe, SiGe:C, Si:C, Si:H, SiSn, and GeSn, and preferably Si. One fin substrate 1A and one fin channel (or one epitaxial fin) 1B may constitute one fin structure together. Wherein, although FIG. 1 only provides one fin for illustration, actually a plurality of parallel fins may be formed so that the drive capability and the gate control capability of the device may be enhanced. Similarly, the following figures also provide one fin only, which, however, is not limited thereto. Furthermore, the at least one fin structure may also be formed by a method of etching the substrate 1 to form a deeper trench, filling insulating dielectric material while leaving at least one vertical protruding fin structure; or performing etching in the SOI substrate to form a trench that penetrates the buried oxide layer to reach the base Si layer, epitaxially growing Si in the trench, then performing selective etching to remove the top Si layer outside the trench area.

Figure 2A:
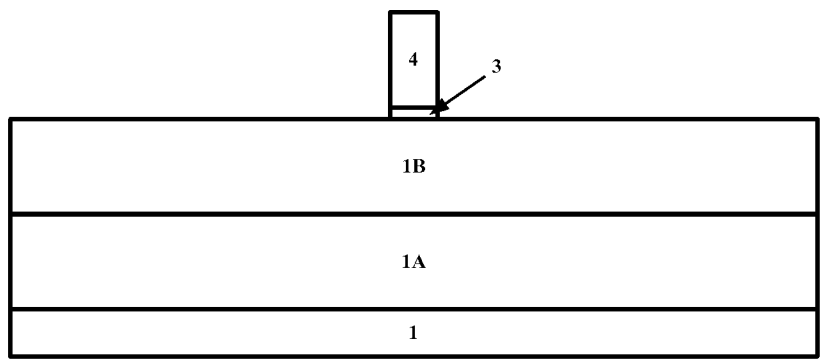
Figure 2B:
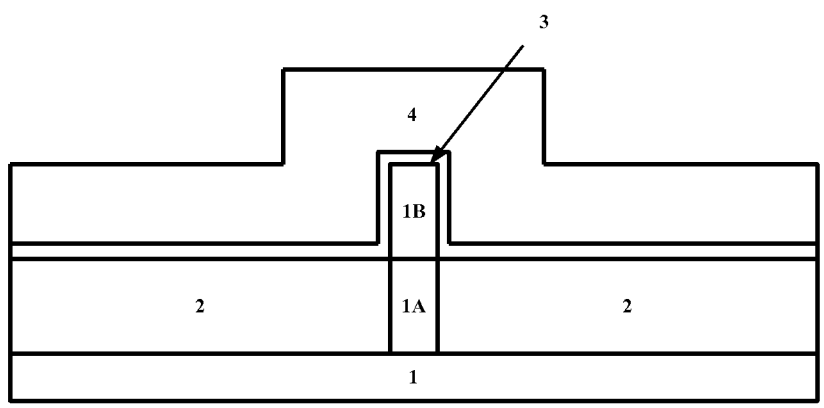

Referring to FIG. 2A and FIG. 2B, a plurality of gate stack structures extending along a second direction are formed, wherein the second direction intersects with the first direction, preferably perpendicular (orthogonal) to the first direction, such that each of the plurality of gate stack structures overlaps and encloses a part of the plurality of fin structures. First, a gate insulating layer 3 is formed on the entire device by a deposition process such as LPCVD, PECVD, HDP-CVD, MOCVD, MBE, ALD, PVD or oxidation (e.g., RTO), then a gate material layer 4 is formed on the gate insulating layer 3 by a deposition process such as LPCVD, PECVD, HDPCVD, MOCVD, MBE, ALD, evaporation, and sputtering. The gate material layer 4 overlaps (the top surface and the sides of) the gate insulating layer 3 and (the top surface of) the STIs 2. Initially, the gate insulating layer 3 and the gate material layer 4 overlap (the top surface and the sides of) the fin channel regions 1B and (the top surface of) the STIs 2, then parts of the gate insulating layer 3 and the gate material layer 4 are removed by photolithography/etching, only leaving that parts which overlap and enclose the fin channel regions 1B. The laminated layer that corresponds to the outside of the channel region to be formed is removed, only leaving a plurality of gate stack structures 4/3 extending along a second direction (which intersects with the first direction and is preferably perpendicular thereto) at a location corresponding to the channel region to be formed (which may be a plurality of channel regions that mutually parallel to each other). Wherein each fin structure on both sides of the gate stack structures 4/3 along a first direction will correspond to the source and drain regions, and the part of each fin structure that is enclosed by the gate stack structures 4/3 will constitute the channel region.

Wherein, in a gate-first process, the gate stack structures are retained as the real gate stack structures of the final device, thus the gate insulating layer 3 may comprise one of silicon oxide, N-doped silicon oxide and silicon nitride, or other high-K materials including but not limited to Hf-based materials selected from $HfO_2$, $HfSiO_x$, HfSiON, $HfAlO_x$, $HfTaO_x$, $HfLaO_x$, $HfAlSiO_x$, and $HfLaSiO_x$, (wherein the content of oxygen atom x for the materials may be reasonably adjusted, e.g., may be 1~6 and may not be limited to an integer depending on the multielement metal component ratio and different chemical valence), rare earth based high-K materials selected from $ZrO_2$, $La_2O_3$, $LaAlO_3$, $TiO_2$, and $Y_2O_3$, $Al_2O_3$, or a composite layer of the above materials; the gate material layer 4 may be polysilicon, polycrystalline silicon germanium or metal, wherein the metal may comprise metal element such as Co, Ni, Cu, Al, Pd, Pt, Ru, Re, Mo, Ta, Ti, Hf, Zr, W, Ir, Eu, Nd, Er, and La, alloy of these metal, or nitride of these metal, and the gate material layer 4 may also be doped with elements such as C, F, N, O, B, P, and As to adjust the work function. A block layer of nitride (not shown) is preferably formed between the gate material layer 4 and the gate insulating layer 3 by a conventional process such as PVD, CVD, and ALD, the material thereof may be one of $M_xN_y$, $M_xSi_yN_z$, $M_xAl_yN_z$ and $M_aAl_x$-$Si_yN_z$, wherein M is Ta, Ti, Hf, Zr, Mo and W or other elements.

In a gate-last process as illustrated in FIG. 5 later, as dummy gate stack structures, the gate stack structures 4/3 will then be removed to form gate trenches, and a gate insulating layer formed of high-K materials and a gate material layer formed of metallic materials will be filled in the gate trenches. So, in the dummy gate stack structures, the gate insulating layer 3 is used as a pad oxide layer and is made of a material of silicon oxide or silicon oxynitride; the gate material layer 4 is used as a dummy gate layer and is made of one of polysilicon, amorphous silicon, microcrystalline silicon, amorphous carbon, poly-germanium and amorphous germanium, or combinations thereof.

Figure 3A:
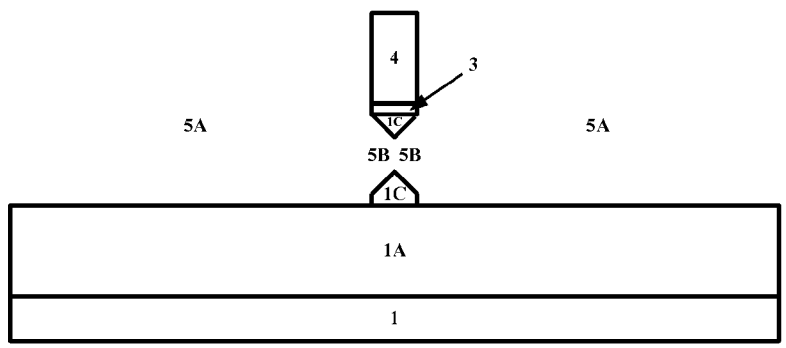
Figure 3B:
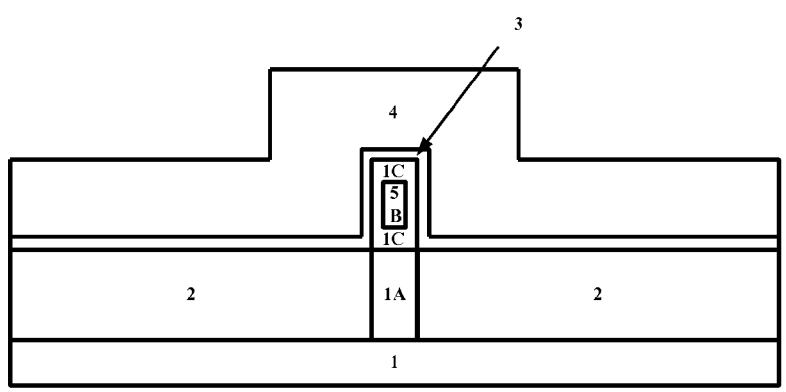

Referring to FIG. 3A and FIG. 3B, the fin structures on both sides of the gate stack structures are etched to form source and drain trenches and the fin structures below the gate stack structures are also etched through.

In one embodiment of the present invention, dry etching, e.g., fluoro-based, chlorine-based, and oxygen-based (reaction) plasma etching is performed in the fin structures 1B on both sides of the gate stack structures 4/3 to form first trenches 5A. The first trenches 5A have substantially or completely vertical sidewalls, that is, the widths of the top and the bottom are substantially or completely the same. The depth of the first trenches 5A may be equal to the height of the fin substrate 1A, that is, etching is performed to expose the substrate 1 at the bottom of the STIs 2, but the depth may also be smaller than the height of the substrate 1A. Although fin structures 1B corresponding to the locations of the source and drain regions are completely removed in the direction of the channel regions (first direction) as shown in FIG. 5A, actually the width of the trenches along the first direction may be reasonably adjusted according to the requirement of the device layout, that is, parts of fin structures 1B at both end portions along the first direction may be retained. Then, wet etching, e.g., using etchant such as TMAH (for Si) or a combination of strong acid/strong oxidant (for compound semiconductors such as SiGe) is performed to laterally etch the sidewalls of the first trenches 5A to form second trenches 5B. While performing the wet etching, the fin channels 1B below the gate stack structures tend to be laterally etched by etchant, to thereby form second trenches 5B located on the sides of the first trenches 5A (along the first direction) and below the gate stack structures. One first trench 5A and one second trench 5B together constitute one source and drain trench having a Σ-shape or inverted trapezoid cross section, wherein the section is selected along a direction perpendicular to the substrate surface and parallel to the direction of the channel region. The so-called Σ-shape or inverted trapezoid cross section means to indicate that the width of the middle of the trenches is greater than that of the top and/or the bottom. Preferably, appropriate etching parameters are selected such that the second trenches 5B extend toward the bottom of the gate stack structures by a width greater than or equal to a half of the width of the gate stack structures, thus the second trenches 5B at both sides are joined or connected, and a part of fin channels 1B below the gate stack structures 4/3 is isolated as the channel regions 1C to be formed. It shall be noted that although FIG. 3A shows that the source and drain regions 5B are located below and obliquely below the channel regions 1C, that is, the channel regions 1C are suspended below the gate stack structures 4/3, however, in a direction perpendicular to the cross section, i.e., the direction of the channel regions (particularly seen from the top view, not shown), since the source and drain trenches 5A/5B have a width smaller than or equal to that of the gate stack structures 4/3 (which is determined by the layout design rules), the channel regions 1C are substantially still connected with the retained part of the fin channels 1B in a distance outside the source and drain trenches in that direction and are thus supported. FIG. 3B shows that the annular channel regions 1C enclose the penetrated second trenches 5B.

Besides, in other embodiments of the present invention, the second trenches 5B may have a shape not limited to the Σ shape, (inverted) trapezoid or triangle as shown in FIG. 3A, but may be a curve, a curved surface, e.g., a C shape (the side surface of the side of the second trenches 5B toward the channel regions 1C is a circular shape, an elliptical shape, and a sector etc. (greater than or equal to a half)) or a D shape (the side surface of the side of the second trenches 5B toward the channel regions 1C is a semicircular shape or a semi-elliptical shape).

In other embodiments of the present invention, the process for performing etching to form the first trenches 5A and the second trenches 5B are not limited to first dry etching then wet etching, the C-shape or D-shape trenches may be formed by isotropic dry etching with CF-based etching gas one time (or two times).

Although the first trenches 5A as shown in FIG. 3A are the openings formed by completely etching the part of fin channels 1B except for the channel regions, in fact a part of the fin channels 1B may be retained on both sides (along the first direction) of the first trenches 5A in FIG. 3A, that is, only a part of the fin channels 1B on both sides (along the first direction) of the gate stack structures 4/3 is removed.

Figure 4A:
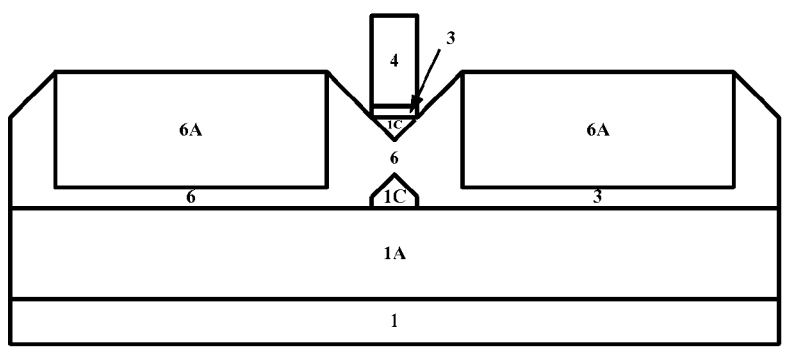
Figure 4B:
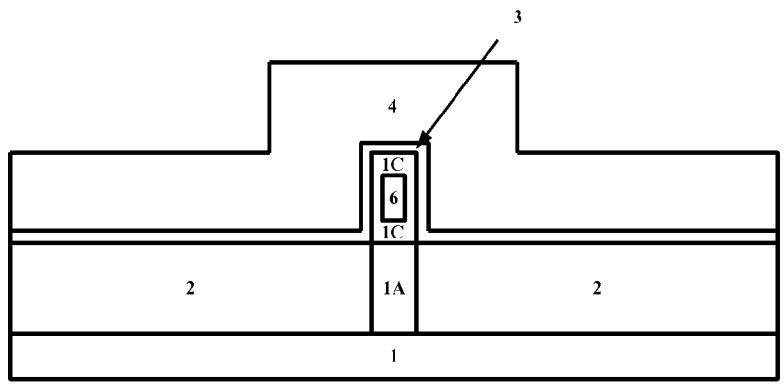

Referring to FIG. 4A and FIG. 4B, stress layers are epitaxially grown in the source and drain trenches. Embedded stress layers 6 are epitaxially grown in the source and drain trenches 5A/5B by an epitaxial growth process such as UHVCVD, MOCVD, ALD, MBE, and atmospheric pressure epitaxy. Wherein, as for different types of MOSFETs, the materials for the stress layers 6 may be not the same. For example, as for a PMOS, the stress layers 6 may be made of one of SiGe, SiSn and GeSn, or combinations thereof, to thereby apply a compressive stress to the channel regions 1C, so as to enhance the hole mobility; while as for a NMOS, the stress layers 6 may be made of one of Si:C, Si:H and SiGe:C or combinations thereof. Moreover, the stress layers 6 shall be made of a Si alloy material different from that of the fin channels 1B. Wherein, as shown in FIG. 4A, the top of the stress layers 6 is higher than the gate insulating layer 3 and is lower than the gate material layer 4, such a configuration is only for the purpose of illustration, so the top height difference may be arbitrarily set.

Preferably, in-situ doping may be performed when the stress layers 6 are epitaxially formed, and the conductivity type of the stress layers 6 may be adjusted depending on the type of the MOSFET, e.g., as for a NMOS, P, As, and Sb etc. may be doped, as for a PMOS, B, Al, Ga and In etc. may be doped. Furthermore, the time point for adding the dopant may be controlled while performing in-situ doping in the epitaxial growth such that the doping concentration of the stress layers 6 close to the bottom of the fin channels 1B is lower than that close to the top of the fin channels 1B, for example, no in-situ doping is performed at the bottom of the stress layers 6, only a compressive stress is applied thereto, and in-situ doping is performed at the top of the stress layers 6 to form source and drain regions 6A. Moreover, ion doping implantation may also be performed after epitaxially growing the stress layers 6 (implanting ions is the same as in-situ doping) to form source and drain regions 6A, while no doping is performed in the area of regions 6 within the channel regions.

Then, referring to FIGS. 5A and 5B, the device is manufactured continuously by taking the gate-last process as an example.

An inter-layer dielectric (ILD) layer 7 is formed on the entire device, the material thereof may be one of silicon oxide, silicon oxynitride and low-K materials including but not limited to organic low-K materials (aryl-containing or polycyclic organic polymer), inorganic low-K materials (e.g., amorphous carbon nitride thin films, polycrystalline boron nitride thin films, fluorsosilicate glass, BSG, PSG, BPSG), and porous low-K materials (e.g., Silsesquioxane (SSQ)-based porous low-K materials, porous silicon dioxide, porous SiOCH, C-doped silicon dioxide, F-doped porous amorphous carbon, porous diamond, porous organic polymer). Then, etching is performed to remove the dummy gate material layer 4 and the pad oxide layer 3 to form gate trenches in ILD 7. Next, a gate insulating layer 3' formed of high-K materials and a gate material layer 4' formed of metallic materials are sequentially deposited in the gate trenches. Wherein, the materials for the gate insulating layer 3' and the gate material layer 4' have been discussed when the high-K materials and the metal gate materials are described by referring to FIG. 2, so no more unnecessary details will be provided here.

Next, the device is continuously manufactured by using the existing technology. For example, the ILD 7 is etched to form source and drain contact holes (not shown); a metal silicide layer 8 is formed in the source and drain contact holes by a process such as evaporation, sputtering, and MOCVD. As for the stress layers 6 comprising element Si (e.g., SiSn, SiGe, Si:C, SiGe:C, and Si:H), a metal layer (not shown) made of one of Ni, Pt, Co, Ti, and Ge or combinations thereof may be directly formed on the source and drain regions 6A whose material is the same as that for the stress layers 6 by a process such as evaporation, sputtering, and MOCVD, then high-temperature is performed under a temperature of about 550-580° C. to form a metal silicide and the unreacted metal layer is removed, leaving a silicide layer 8 on the source and drain regions 6A, the material thereof may be, e.g., $CoSi_2$, $TiSi_2$, NiSi, PtSi, NiPtSi, CoGeSi, TiGeSi, and NiGeSi so as to reduce the source and drain contact resistance. As for the stress layers 6 not comprising element Si (e.g., GeSn), a layer formed of Si (not shown) may be epitaxially grown on the source and drain regions 6A, then the above similar metal silicide process is adopted to form a silicide layer 8.

Thereafter, etching is further performed to form source and drain contact holes and metal is filled to form metal plugs, so as to manufacture the device finally (not shown in the drawings).

The finally formed device structure is as shown in FIG. 6, comprising a plurality of fins 1B extending along a first direction, a plurality of gate stack structures (4/3 or 4'/3') extending along a second direction and across each of the fins, a plurality of stress layers 6 on the fins on both sides of the gate stack structures and source and drain regions 6A in the stress layers 6, a plurality of channel regions 1C in the fins below the gate stack structures, wherein the stress layers 6 have connected parts in the fins and the channel regions 1C enclose the connected parts. The materials and the geometric shapes of these structures have been described in detail in the disclosure of method, thus no more unnecessary details will be provided here.

In accordance with the semiconductor device and the method of manufacturing the same of the present invention, annular stereo strain channel regions along the surface of the silicon fins enclosing the stereo source and drain connection regions are formed by connecting the stereo source and drain comprised of high-stress silicide alloy within the silicon fins, so that the stress in the channel regions is increased all-roundly, and the carrier mobility is enhanced effectively, thereby the drive capability of the device is enhanced efficiently.

Although the present invention has been described with reference to one or more illustrative embodiments, it may be appreciated by those skilled in the art that various appropriate modifications and equivalents can be made to the device structure without departing from the scope of the present invention. Besides, many modifications adaptable to specific situations or materials can be made under the disclosed teaching without departing from the scope of the present invention. Therefore, it is not intended to limit the present invention to the specific embodiments which are disclosed as the preferred embodiments for implementing the present invention, the disclosed device structure and the manufacturing method thereof will include all the embodiments that come within the scope of the present invention.

What is claimed is:

1. A semiconductor device, comprising:
  a plurality of fins located on a substrate and extending along a first direction;
  a plurality of gate stack structures extending along a second direction and across each of the fins;
  a plurality of stress layers located in the fins on both sides of the gate stack structures and having a plurality of source and drain regions therein;
  a plurality of channel regions located in the fins below the gate stack structures each of channel regions having a different thickness at different sites under the gate stack structures along the first direction;
  wherein the stress layers have connected parts in the fins and that the channel regions enclose the connected parts,
  wherein the connected parts are of a shape of one of Σ, C, and D; and wherein a top surface of each stress layer in the source and drain regions is above a top surface of a gate insulating layer of each gate stack structure, and
  wherein each of the stress layers extends in the first direction and has a different thickness at different sites under the gate stack structures along the first direction.

2. The semiconductor device according to claim 1, wherein the material for the fins is different from that for the stress layers.

3. The semiconductor device according to claim 2, wherein the fins are made of a material selected from Si, SiGe, SiSn, GeSn, Si:C, Si:H and SiGe:C, or combinations thereof, and the stress layers are made of a Si alloy material selected from SiGe, SiSn, GeSn, Si:C, Si:H and SiGe:C, or combinations thereof.

4. The semiconductor device according to claim 1, wherein the gate stack structures each comprises a gate insulating layer formed of high-K materials and a gate material layer formed of metallic materials.

5. The semiconductor device according to claim 1, wherein a metal silicide is formed in/on the source and drain regions.

* * * * *